(12) United States Patent
Kim et al.

(10) Patent No.: US 8,932,069 B2
(45) Date of Patent: Jan. 13, 2015

(54) SOCKET MODULE AND TERMINAL HAVING THE SAME

(71) Applicant: LG Electronics Inc., Seoul (KR)

(72) Inventors: Kyoungtae Kim, Seoul (KR); Soonsung Kwon, Seoul (KR); Minho Park, Seoul (KR); Doohwan Jo, Seoul (KR); Sangchul Jeon, Seoul (KR)

(73) Assignee: LG Electronics Inc., Seoul (KR)

( * ) Notice: Subject to any disclaimer, the term of this patent is extended or adjusted under 35 U.S.C. 154(b) by 58 days.

(21) Appl. No.: 13/693,365

(22) Filed: Dec. 4, 2012

(65) Prior Publication Data

US 2013/0143435 A1  Jun. 6, 2013

(30) Foreign Application Priority Data

Dec. 6, 2011  (KR) .................. 10-2011-0129763

(51) Int. Cl.
| | |
|---|---|
| H01R 12/00 | (2006.01) |
| H01R 13/73 | (2006.01) |
| H04M 1/02 | (2006.01) |
| H01R 12/70 | (2011.01) |
| H01R 12/72 | (2011.01) |
| H01R 13/453 | (2006.01) |

(52) U.S. Cl.
CPC .............. *H01R 13/73* (2013.01); *H04M 1/026* (2013.01); *H04M 1/0274* (2013.01); *H01R 12/7058* (2013.01); *H01R 12/721* (2013.01); H01R 13/4538 (2013.01); H01R 2201/16 (2013.01)
USPC .......................................................... 439/79

(58) Field of Classification Search
USPC ............................................................ 439/79
See application file for complete search history.

(56) References Cited

U.S. PATENT DOCUMENTS

| | | | | |
|---|---|---|---|---|
| 3,745,510 | A * | 7/1973 | Mallon ............................ | 439/78 |
| 4,080,522 | A * | 3/1978 | Schimmels .................... | 200/295 |
| 4,695,112 | A * | 9/1987 | Maston et al. ................. | 439/350 |
| 4,708,415 | A * | 11/1987 | White ............................ | 439/633 |
| 4,717,218 | A * | 1/1988 | Ratcliff ............................ | 439/59 |
| 4,915,655 | A * | 4/1990 | Tanaka .......................... | 439/676 |
| 4,997,996 | A * | 3/1991 | Ohashi ........................... | 174/260 |
| 5,035,641 | A * | 7/1991 | Van-Santbrink et al. ..... | 439/329 |
| 5,037,309 | A * | 8/1991 | Abe et al. ........................ | 439/56 |
| 5,160,275 | A * | 11/1992 | Nakamura et al. ............ | 439/328 |
| 5,184,961 | A * | 2/1993 | Ramirez et al. ................ | 439/59 |
| 5,277,596 | A * | 1/1994 | Dixon ............................. | 439/79 |
| 5,702,271 | A * | 12/1997 | Steinman ....................... | 439/676 |

(Continued)

FOREIGN PATENT DOCUMENTS

| | | |
|---|---|---|
| EP | 0 920 167 A2 | 6/1999 |
| WO | WO 89/07849 A1 | 8/1989 |

*Primary Examiner* — Ross Gushi
(74) *Attorney, Agent, or Firm* — Birch, Stewart, Kolasch & Birch, LLP

(57) ABSTRACT

A terminal in accordance with one exemplary embodiment of the present disclosure includes a terminal body, a substrate mounted onto the terminal body, and a socket module coupled to the substrate to transfer an electrical signal by being electrically connected to an inserted plug, and the socket module includes a housing having an opening at one surface thereof, the plug being inserted into the opening, and a coupling unit formed at at least one side of the housing, and slidable with respect to the substrate upon being coupled to the substrate. This may allow a substrate assembly coupled with the socket module to become slimmer by a thickness of the substrate, resulting in providing a more size-reduced terminal.

17 Claims, 12 Drawing Sheets

(56) References Cited

U.S. PATENT DOCUMENTS

| | | | | |
|---|---|---|---|---|
| 5,755,586 A * | 5/1998 | Knighton et al. | | 439/328 |
| 5,897,386 A * | 4/1999 | Baxter et al. | | 439/79 |
| 5,944,536 A * | 8/1999 | Seong et al. | | 439/79 |
| 5,989,040 A * | 11/1999 | Nishimatsu | | 439/79 |
| 6,036,507 A * | 3/2000 | Knighton et al. | | 439/79 |
| 6,068,501 A * | 5/2000 | Knighton et al. | | 439/328 |
| 6,095,865 A * | 8/2000 | Wu | | 439/607.01 |
| 6,109,966 A * | 8/2000 | Chiou | | 439/607.03 |
| 6,123,550 A * | 9/2000 | Burkert et al. | | 439/63 |
| 6,129,562 A * | 10/2000 | Hong | | 439/79 |
| 6,171,148 B1 * | 1/2001 | Chiu et al. | | 439/607.01 |
| 6,238,249 B1 * | 5/2001 | Kuwamura | | 439/668 |
| 6,315,620 B1 * | 11/2001 | Moir et al. | | 439/862 |
| 6,325,674 B1 * | 12/2001 | Oliphant et al. | | 439/676 |
| 6,364,708 B1 * | 4/2002 | Chen et al. | | 439/607.37 |
| 6,398,587 B1 * | 6/2002 | Chen et al. | | 439/607.35 |
| 6,416,358 B1 * | 7/2002 | Kamarauskas et al. | | 439/607.38 |
| 6,666,694 B1 * | 12/2003 | Daly et al. | | 439/79 |
| 6,692,273 B1 * | 2/2004 | Korsunsky et al. | | 439/108 |
| 6,736,651 B2 * | 5/2004 | Ho | | 439/79 |
| 6,752,662 B2 * | 6/2004 | Okamoto | | 439/607.04 |
| 6,790,047 B2 * | 9/2004 | Togashi | | 439/63 |
| 6,824,429 B2 * | 11/2004 | Hwang | | 439/607.2 |
| 6,827,610 B2 * | 12/2004 | Lin | | 439/607.37 |
| 7,081,011 B2 * | 7/2006 | Kikuchi et al. | | 439/541.5 |
| 7,182,610 B2 * | 2/2007 | Lin | | 439/79 |
| 7,217,159 B2 * | 5/2007 | Chung | | 439/607.01 |
| 7,448,898 B2 * | 11/2008 | Tae et al. | | 439/367 |
| 7,458,826 B1 * | 12/2008 | Maatta | | 439/79 |
| 7,473,143 B2 * | 1/2009 | Chen | | 439/670 |
| 7,497,732 B2 * | 3/2009 | Yi | | 439/607.23 |
| 7,500,876 B2 * | 3/2009 | Chang | | 439/607.05 |
| 7,534,146 B2 * | 5/2009 | Chien et al. | | 439/668 |
| 7,572,130 B1 * | 8/2009 | Zhang | | 439/79 |
| 7,654,835 B1 * | 2/2010 | Chiang | | 439/137 |
| 7,670,150 B2 * | 3/2010 | Hisamatsu et al. | | 439/79 |
| 7,731,518 B2 * | 6/2010 | Miyazoe | | 439/328 |
| 7,753,737 B2 * | 7/2010 | Yang et al. | | 439/660 |
| 7,828,574 B2 * | 11/2010 | Zhu | | 439/328 |
| 7,866,989 B1 * | 1/2011 | Zhu | | 439/79 |
| 7,883,369 B1 * | 2/2011 | Sun et al. | | 439/607.35 |
| 7,955,112 B2 * | 6/2011 | Yang et al. | | 439/328 |
| 7,997,932 B2 * | 8/2011 | Xu | | 439/607.04 |
| 8,007,290 B1 * | 8/2011 | Wolff et al. | | 439/79 |
| 8,070,526 B2 * | 12/2011 | Zhu | | 439/660 |
| 8,096,815 B2 * | 1/2012 | Zhu | | 439/83 |
| 8,109,777 B2 * | 2/2012 | Zhu | | 439/326 |
| 8,139,375 B2 * | 3/2012 | Takizawa et al. | | 361/807 |
| 8,142,225 B2 * | 3/2012 | Yu | | 439/607.35 |
| 8,157,585 B2 * | 4/2012 | Zhu | | 439/571 |
| 8,215,989 B2 * | 7/2012 | Tamm et al. | | 439/607.01 |
| 8,221,137 B2 * | 7/2012 | Zheng et al. | | 439/80 |
| 8,272,897 B1 * | 9/2012 | Lin | | 439/607.4 |
| 8,323,057 B2 * | 12/2012 | Ho | | 439/660 |
| 8,337,248 B1 * | 12/2012 | Lan et al. | | 439/607.35 |
| 8,342,886 B2 * | 1/2013 | Zhang et al. | | 439/660 |
| 8,353,726 B2 * | 1/2013 | Zhang et al. | | 439/629 |
| 8,450,620 B2 * | 5/2013 | Cai | | 174/260 |
| 8,465,299 B2 * | 6/2013 | Ho | | 439/79 |
| 8,564,291 B2 * | 10/2013 | Nelson et al. | | 324/309 |
| 8,568,172 B1 * | 10/2013 | Lan et al. | | 439/607.4 |
| 8,573,988 B2 * | 11/2013 | Fujikawa | | 439/79 |
| 8,662,905 B2 * | 3/2014 | Chang | | 439/142 |
| 8,668,520 B2 * | 3/2014 | Hsu et al. | | 439/567 |
| 2002/0086581 A1 * | 7/2002 | Chen et al. | | 439/607 |
| 2002/0173202 A1 * | 11/2002 | Okamoto | | 439/607 |
| 2002/0193006 A1 * | 12/2002 | Ma et al. | | 439/669 |
| 2003/0003783 A1 * | 1/2003 | Song et al. | | 439/76.1 |
| 2003/0003809 A1 * | 1/2003 | Maiers | | 439/629 |
| 2003/0017748 A1 * | 1/2003 | Morita et al. | | 439/680 |
| 2003/0171014 A1 * | 9/2003 | Lin | | 439/79 |
| 2003/0207600 A1 * | 11/2003 | Ho | | 439/79 |
| 2004/0121625 A1 * | 6/2004 | Togashi | | 439/63 |
| 2004/0157491 A1 * | 8/2004 | Lin | | 439/607 |
| 2004/0180577 A1 * | 9/2004 | Zhang | | 439/607 |
| 2004/0229484 A1 * | 11/2004 | Uchida | | 439/137 |
| 2004/0242069 A1 * | 12/2004 | Yang | | 439/607 |
| 2005/0026481 A1 * | 2/2005 | Nishio et al. | | 439/137 |
| 2005/0124225 A1 * | 6/2005 | Wang | | 439/676 |
| 2005/0233602 A1 * | 10/2005 | Link | | 439/59 |
| 2006/0216996 A1 * | 9/2006 | Chen | | 439/607 |
| 2006/0234530 A1 * | 10/2006 | Chung | | 439/79 |
| 2007/0117459 A1 * | 5/2007 | Chen | | 439/607 |
| 2008/0057795 A1 * | 3/2008 | Chen | | 439/723 |
| 2008/0242127 A1 * | 10/2008 | Murr et al. | | 439/79 |
| 2009/0011623 A1 * | 1/2009 | Hisamatsu et al. | | 439/79 |
| 2009/0029567 A1 * | 1/2009 | Yi | | 439/66 |
| 2009/0142944 A1 * | 6/2009 | Zhu | | 439/79 |
| 2009/0291581 A1 * | 11/2009 | Zhu et al. | | 439/325 |
| 2009/0305577 A1 * | 12/2009 | Bradford-Stagg | | 439/680 |
| 2009/0311895 A1 * | 12/2009 | Chen | | 439/218 |
| 2010/0009555 A1 * | 1/2010 | Zhu | | 439/65 |
| 2010/0015836 A1 * | 1/2010 | Zhu | | 439/329 |
| 2010/0061055 A1 * | 3/2010 | Dabov et al. | | 361/679.56 |
| 2010/0099307 A1 * | 4/2010 | Zhang et al. | | 439/660 |
| 2010/0173527 A1 * | 7/2010 | Zhou | | 439/630 |
| 2010/0203749 A1 * | 8/2010 | Ihara et al. | | 439/135 |
| 2010/0225306 A1 * | 9/2010 | Slaton | | 324/149 |
| 2010/0267259 A1 * | 10/2010 | Sun | | 439/131 |
| 2011/0053387 A1 * | 3/2011 | Liu et al. | | 439/55 |
| 2011/0092104 A1 * | 4/2011 | Yu et al. | | 439/660 |
| 2011/0097908 A1 * | 4/2011 | Lin et al. | | 439/64 |
| 2011/0104956 A1 * | 5/2011 | Guo et al. | | 439/668 |
| 2011/0195605 A1 * | 8/2011 | Zhang et al. | | 439/638 |
| 2011/0263142 A1 * | 10/2011 | Huang et al. | | 439/83 |
| 2012/0108109 A1 * | 5/2012 | Zhang et al. | | 439/629 |
| 2012/0178272 A1 * | 7/2012 | Little et al. | | 439/55 |
| 2012/0184117 A1 * | 7/2012 | Fujikawa | | 439/81 |
| 2012/0238145 A1 * | 9/2012 | Zhang et al. | | 439/660 |
| 2013/0143435 A1 * | 6/2013 | Kim et al. | | 439/527 |
| 2013/0308283 A1 * | 11/2013 | Murakami | | 361/752 |
| 2014/0027256 A1 * | 1/2014 | Park et al. | | 200/5 A |
| 2014/0080333 A1 * | 3/2014 | Tochi et al. | | 439/131 |

\* cited by examiner

SOCKET MODULE AND TERMINAL HAVING THE SAME

CROSS-REFERENCE TO RELATED APPLICATION

Pursuant to 35 U.S.C. §119(a), this application claims the benefit of earlier filing date and right of priority to Korean Application No. 10-2011-0129763, filed on Dec. 6, 2011, the contents of which is incorporated by reference herein in its entirety.

BACKGROUND OF THE INVENTION

1. Field of the Invention

This specification relates to a socket module capable of being applied to an interface unit of a terminal.

2. Background of the Invention

Terminals may include a User Equipment (UE), a Mobile Equipment (ME), a Mobile Station (MS), a User Terminal (UT), a Subscriber Station (ST), a Mobile Subscriber Station (MSS), a wireless device, a handheld device, an access terminal and the like.

As it becomes multifunctional, the terminal can be allowed to capture still images or moving images, play music or video files, play games, receive broadcast and the like, so as to be implemented as an integrated multimedia player.

Terminals may be divided into mobile/portable terminals and stationary terminals according to their mobility. Also, the mobile terminals may be categorized into a handheld terminal and a vehicle mount terminal according to whether it is directly portable by a user. Mobile device (mobile terminal, portable device, portable terminal) can be easily carried and have one or more of functions such as supporting voice and video telephony calls, inputting and/or outputting information, storing data and the like.

Various new attempts have been made for the terminals by hardware or software in order to implement and enhance such complicated functions.

An interface may include a socket which is a path for allowing a terminal to exchange data with external devices and connected to a plug. Therefore, a socket module, which is configured for a plug to be inserted therein for stable transmission and reception of signals and is facilitated to be coupled to a substrate or other components in the terminal, may be taken into account.

SUMMARY OF THE INVENTION

Therefore, an aspect of the detailed description is to provide a socket module capable of simplifying an assembly process by virtue of a more improved structure.

Another aspect of the detailed description is to provide a socket module capable of being more stably coupled to other components within a terminal.

To achieve these and other advantages and in accordance with the purpose of this specification, as embodied and broadly described herein, there is provided a terminal including a terminal body, a substrate mounted onto the terminal body, and a socket module coupled to the substrate to transfer an electrical signal by being electrically connected to an inserted plug. Here, the socket module may include a housing having an opening at one surface thereof, the plug being inserted into the opening, and a coupling unit formed at at least one side of the housing, and slidable with respect to the substrate upon being coupled to the substrate.

In accordance with one aspect of the detailed description, the substrate may include a module mounting unit opened into a shape corresponding to a section of the socket module such that the socket module is mounted thereonto.

In accordance with one aspect of the detailed description, the socket module may further include a first pin disposed within the housing and electrically connected to the plug, and a second pin having one end connected to the first pin and the other end extending to the outside of the housing to be connected to the substrate.

In accordance with one aspect of the detailed description, the coupling unit may include a groove member in which a part of the substrate is inserted upon being moved in the sliding direction with respect to the substrate.

In accordance with one aspect of the detailed description, the coupling unit may further include an extension member extending toward the substrate to cover at least one surface of the inserted substrate.

In accordance with one aspect of the detailed description, the second pin may penetrate through the groove member to be electrically connected to a terminal portion formed on the inserted substrate.

In accordance with one aspect of the detailed description, the coupling unit may include a protrusion member protruding toward the substrate, and the substrate may include a groove portion corresponding to the protrusion member.

In accordance with one aspect of the detailed description, the second pin may extend through the protrusion member to be electrically connected to a terminal portion formed on the groove portion.

In accordance with one aspect of the detailed description, the terminal may further include a lock portion protruding from one of the coupling unit or the substrate, and a stopping portion formed at the other one of the coupling unit or the substrate in a shape corresponding to the lock portion. The lock portion and the stopping portion may allow the socket module to be fixed in the coupled state.

In accordance with one aspect of the detailed description, the sliding direction may be a direction of penetrating through the substrate.

In accordance with one aspect of the detailed description, the coupling unit may include an elastic protrusion member protruding toward the substrate and formed to be elastically transformable, and the substrate may include a recess portion corresponding to the elastic protrusion member.

In accordance with one aspect of the detailed description, the coupling unit may include a recess member recessed inwardly, and the substrate may include an elastic protrusion portion protruding toward the recess member and formed to elastically transformable.

In accordance with one aspect of the detailed description, the socket module may further include a cover formed to open or close the opening.

In accordance with one aspect of the detailed description, the coupling unit may be formed on both side surfaces of the housing.

In accordance with another exemplary embodiment of the detailed description, there is provided a terminal including a terminal body, a carrier mounted onto the terminal body and having a radiation pattern for transmission and reception of a wireless signal, and a socket module coupled to the carrier so as to transfer an electric signal to the carrier by being electrically connected to an inserted plug. Here, the socket module may include a housing having an opening at one surface thereof such that the plug can be inserted thereinto, and a coupling unit formed at at least one side of the housing and slidable with respect to the carrier upon being coupled to the substrate.

A terminal in accordance with at least one exemplary embodiment of the present disclosure may not require a separate process upon coupling a socket module to a substrate, resulting in a process simplification and a cost reduction.

Also, a substrate assembly that the socket module and the substrate are coupled to each other may become slimmer by a thickness of the substrate, providing a more size-reduced terminal.

A reliable coupling between pins of the socket module and a terminal portion of the substrate may be provided.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings:

FIG. 7 is a conceptual view showing a variation of a pin shown in

FIG. 5;

DETAILED DESCRIPTION OF THE INVENTION

Description will now be given in detail of a mobile terminal according to the exemplary embodiments, with reference to the accompanying drawings. For the sake of brief description with reference to the drawings, the same or equivalent components will be provided with the same reference numbers, and description thereof will not be repeated. The expression in the singular form in this specification will cover the expression in the plural form unless otherwise indicated obviously from the context.

Mobile terminals described in this specification may include cellular phones, smart phones, laptop computers, digital broadcasting terminals, personal digital assistants (PDAs), portable multimedia players (PMPs), navigators, and the like. However, it may be easily understood by those skilled in the art that the configuration according to the exemplary embodiments of this specification can be applied to stationary terminals such as digital TV, desktop computers and the like excluding a case of being applicable only to the mobile terminals.

Figure 1:
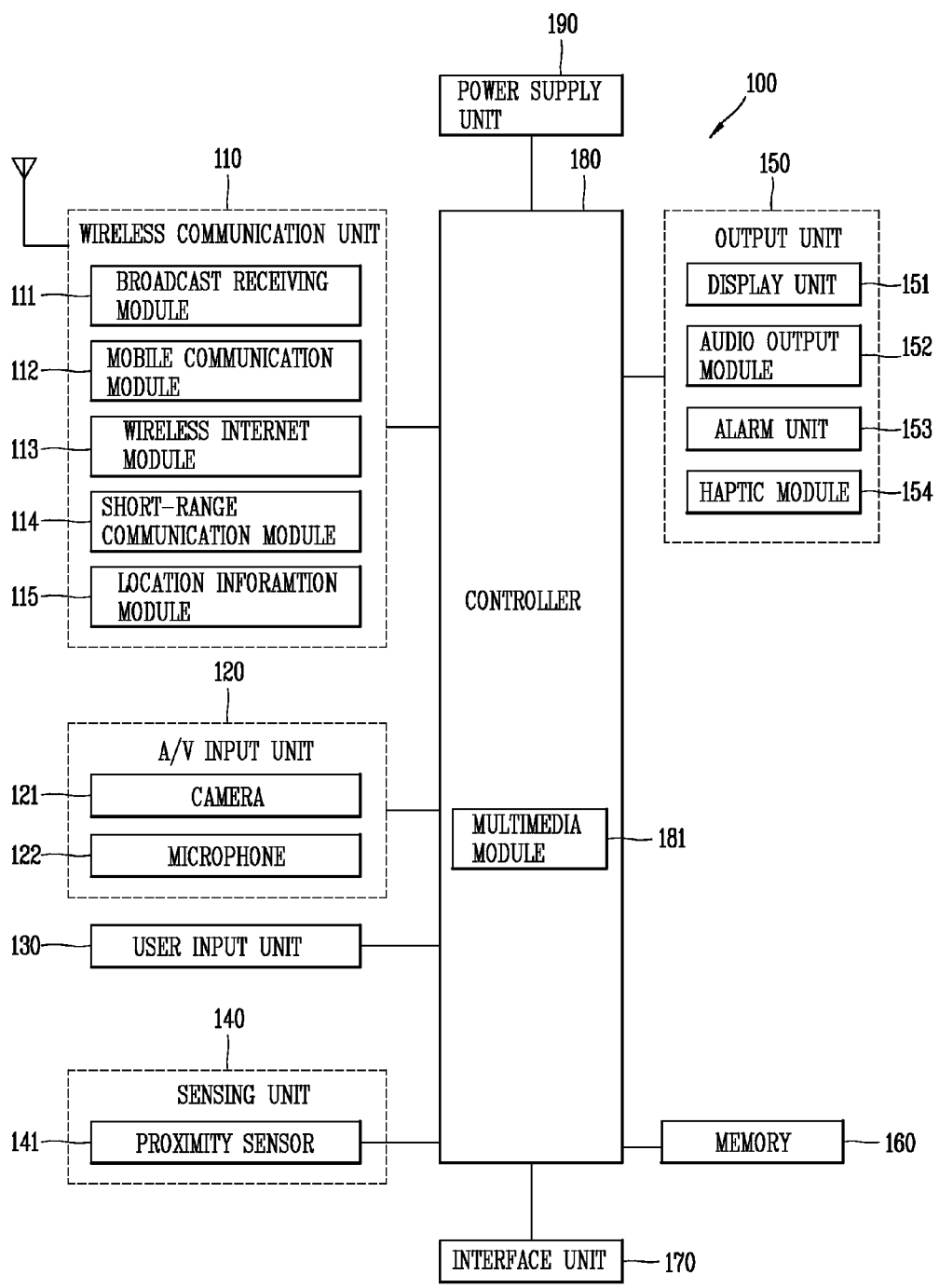
FIG. 1 is a block diagram of a mobile terminal in accordance with one exemplary embodiment.

FIG. 1 is a block diagram of a mobile terminal 100 in accordance with one exemplary embodiment.

The mobile terminal 100 may comprise components, such as a wireless communication unit 110, an Audio/Video (A/V) input unit 120, a user input unit 130, a sensing unit 140, an output unit 150, a memory 160, an interface unit 170, a controller 180, a power supply 190 and the like. FIG. 1 shows the mobile terminal 100 having various components, but it is understood that implementing all of the illustrated components is not a requirement. Greater or fewer components may alternatively be implemented.

Hereinafter, each component is described in sequence.

The wireless communication unit 110 may typically include one or more modules which permit wireless communications between the mobile terminal 100 and a wireless communication system or between the mobile terminal 100 and a network within which the mobile terminal 100 is located. For example, the wireless communication unit 110 may include a broadcast receiving module 111, a mobile communication module 112, a wireless Internet module 113, a short-range communication module 114, a location information module 115 and the like.

The broadcast receiving module 111 receives a broadcast signal and/or broadcast associated information from an external broadcast managing entity via a broadcast channel.

The broadcast channel may include a satellite channel and a terrestrial channel. The broadcast managing entity may indicate a server which generates and transmits a broadcast signal and/or broadcast associated information or a server which receives a pre-generated broadcast signal and/or broadcast associated information and sends them to the mobile terminal. The broadcast signal may be implemented as a TV broadcast signal, a radio broadcast signal, and a data broadcast signal, among others. The broadcast signal may further include a data broadcast signal combined with a TV or radio broadcast signal.

Examples of broadcast associated information may include information associated with a broadcast channel, a broadcast program, a broadcast service provider, and the like. The broadcast associated information may be provided via a mobile communication network, and received by the mobile communication module 112.

The broadcast associated information may be implemented in various formats. For instance, broadcast associated information may include Electronic Program Guide (EPG) of Digital Multimedia Broadcasting (DMB), Electronic Service Guide (ESG) of Digital Video Broadcast-Handheld (DVB-H), and the like.

The broadcast receiving module 111 may be configured to receive digital broadcast signals transmitted from various types of broadcast systems. Such broadcast systems may include Digital Multimedia Broadcasting-Terrestrial (DMB-T), Digital Multimedia Broadcasting-Satellite (DMB-S), Media Forward Link Only (MediaFLO), Digital Video Broadcast-Handheld (DVB-H), Integrated Services Digital Broadcast-Terrestrial (ISDB-T) and the like. The broadcast receiving module 111 may be configured to be suitable for every broadcast system transmitting broadcast signals as well as the digital broadcasting systems.

Broadcast signals and/or broadcast associated information received via the broadcast receiving module 111 may be stored in a suitable device, such as a memory 160.

The mobile communication module 112 transmits/receives wireless signals to/from at least one of network entities (e.g., base station, an external mobile terminal, a server, etc.) on a mobile communication network. Here, the wireless signals may include audio call signal, video (telephony) call signal, or various formats of data according to transmission/reception of text/multimedia messages.

The wireless Internet module 113 supports wireless Internet access for the mobile terminal. This module may be internally or externally coupled to the mobile terminal 100. Examples of such wireless Internet access may include Wireless LAN (WLAN) (Wi-Fi), Wireless Broadband (Wibro), Worldwide Interoperability for Microwave Access (Wimax), High Speed Downlink Packet Access (HSDPA) and the like.

The short-range communication module 114 denotes a module for short-range communications. Suitable technologies for implementing this module may include BLUE-TOOTH™, Radio Frequency IDentification (RFID), Infrared Data Association (IrDA), Ultra-WideBand (UWB), ZigBee™, and the like.

The location information module 115 denotes a module for detecting or calculating a position of a mobile terminal. An example of the location information module 115 may include a Global Position System (GPS) module.

Referring to FIG. 1, the A/V input unit 120 is configured to provide audio or video signal input to the mobile terminal. The A/V input unit 120 may include a camera 121 and a microphone 122. The camera 121 receives and processes image frames of still pictures or video obtained by image sensors in a video call mode or a capturing mode. The processed image frames may be displayed on a display unit 151.

The image frames processed by the camera 121 may be stored in the memory 160 or transmitted to the exterior via the wireless communication unit 110. Two or more cameras 121 may be provided according to the configuration of the mobile terminal.

The microphone 122 may receive an external audio signal while the mobile terminal is in a particular mode, such as a phone call mode, a recording mode, a voice recognition mode, or the like. This audio signal is processed into digital data. The processed digital data is converted for output into a format transmittable to a mobile communication base station via the mobile communication module 112 in case of the phone call mode. The microphone 122 may include assorted noise removing algorithms to remove noise generated in the course of receiving the external audio signal.

The user input unit 130 may generate input data input by a user to control the operation of the mobile terminal. The user input unit 130 may include a keypad, a dome switch, a touchpad (e.g., static pressure/capacitance), a jog wheel, a jog switch and the like.

The sensing unit 140 provides status measurements of various aspects of the mobile terminal. For instance, the sensing unit 140 may detect an open/close status of the mobile terminal, a change in a location of the mobile terminal 100, a presence or absence of user contact with the mobile terminal 100, the location of the mobile terminal 100, acceleration/deceleration of the mobile terminal 100, and the like, so as to generate a sensing signal for controlling the operation of the mobile terminal 100. For example, regarding a slide-type mobile terminal, the sensing unit 140 may sense whether a sliding portion of the mobile terminal is open or closed. Other examples include sensing functions, such as the sensing unit 140 sensing the presence or absence of power provided by the power supply 190, the presence or absence of a coupling or other connection between the interface unit 170 and an external device. Meanwhile, the sensing unit 140 may include a proximity sensor 141.

The output unit 150 is configured to output an audio signal, a video signal or a tactile signal. The output unit 150 may include a display unit 151, an audio output module 152, an alarm unit 153 and a haptic module 154.

The display unit 151 may output information processed in the mobile terminal 100. For example, when the mobile terminal is operating in a phone call mode, the display unit 151 will provide a User Interface (UI) or a Graphic User Interface (GUI), which includes information associated with the call. As another example, if the mobile terminal is in a video call mode or a capturing mode, the display unit 151 may additionally or alternatively display images captured and/or received, UI, or GUI.

The display unit 151 may be implemented using, for example, at least one of a Liquid Crystal Display (LCD), a Thin Film Transistor-Liquid Crystal Display (TFT-LCD), an Organic Light-Emitting Diode (OLED), a flexible display, a three-dimensional (3D) display or the like.

Some of such displays 151 may be implemented as a transparent type or an optical transparent type through which the exterior is visible, which is referred to as 'transparent display'. A representative example of the transparent display may include a Transparent OLED (TOLED), and the like. The rear surface of the display unit 151 may also be implemented to be optically transparent. Under this configuration, a user can view an object positioned at a rear side of a terminal body through a region occupied by the display unit 151 of the terminal body.

The display unit 151 may be implemented in two or more in number according to a configured aspect of the mobile terminal 100. For instance, a plurality of the displays 151 may be arranged on one surface to be spaced apart from or integrated with each other, or may be arranged on different surfaces.

Here, if the display unit 151 and a touch sensitive sensor (referred to as a touch sensor) have a layered structure therebetween, the structure may be referred to as a touch screen. The display unit 151 may be used as an input device rather than an output device. The touch sensor may be implemented as a touch film, a touch sheet, a touchpad, and the like.

The touch sensor may be configured to convert changes of a pressure applied to a specific part of the display unit 151, or a capacitance occurring from a specific part of the display unit 151, into electric input signals. Also, the touch sensor may be configured to sense not only a touched position and a touched area, but also touch pressure.

When touch inputs are sensed by the touch sensors, corresponding signals are transmitted to a touch controller. The touch controller processes the received signals, and then transmits corresponding data to the controller 180. Accordingly, the controller 180 may sense which region of the display unit 151 has been touched.

Still referring to FIG. 1, a proximity sensor 141 may be arranged at an inner region of the mobile terminal 100 covered by the touch screen, or near the touch screen. The proximity sensor 141 indicates a sensor to sense presence or absence of an object approaching to a surface to be sensed, or an object disposed near a surface to be sensed, by using an electromagnetic field or infrared rays without a mechanical contact. The proximity sensor 141 has a longer lifespan and a more enhanced utility than a contact sensor.

The proximity sensor 141 may include a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and so on. When the touch screen is implemented as a capacitance type, proximity of a pointer to the touch screen is sensed by changes of an electromagnetic field. In this case, the touch screen (touch sensor) may be categorized into a proximity sensor.

Hereinafter, for the sake of brief explanation, a status that the pointer is positioned to be proximate onto the touch screen without contact will be referred to as 'proximity touch', whereas a status that the pointer substantially comes in contact with the touch screen will be referred to as 'contact touch'. For the position corresponding to the proximity touch of the pointer on the touch screen, such position corresponds to a position where the pointer faces perpendicular to the touch screen upon the proximity touch of the pointer.

The proximity sensor 141 senses proximity touch, and proximity touch patterns (e.g., distance, direction, speed, time, position, moving status, etc.). Information relating to the sensed proximity touch and the sensed proximity touch patterns may be output onto the touch screen.

The audio output module 152 may output audio data received from the wireless communication unit 110 or stored in the memory 160, in a call-receiving mode, a call-placing mode, a recording mode, a voice recognition mode, a broadcast reception mode, and so on. The audio output module 152 may output audio signals relating to functions performed in the mobile terminal 100, e.g., sound alarming a call received or a message received, and so on. The audio output module 152 may include a receiver, a speaker, a buzzer, and so on.

The alarm unit 153 outputs signals notifying occurrence of events from the mobile terminal 100. The events occurring from the mobile terminal 100 may include call received, message received, key signal input, touch input, and so on. The alarm unit 153 may output not only video or audio signals, but also other types of signals such as signals notifying occurrence of events in a vibration manner. Since the video or audio signals can be output through the display unit 151 or the audio output module 152, the display unit 151 and the audio output module 152 may be categorized into a part of the alarm unit 153.

The haptic module 154 generates various tactile effects which a user can feel. A representative example of the tactile effects generated by the haptic module 154 includes vibration. Vibration generated by the haptic module 154 may have a controllable intensity, a controllable pattern, and so on. For instance, different vibration may be output in a synthesized manner or in a sequential manner.

The haptic module 154 may generate various tactile effects, including not only vibration, but also arrangement of pins vertically moving with respect to a skin being touched (contacted), air injection force or air suction force through an injection hole or a suction hole, touch by a skin surface, presence or absence of contact with an electrode, effects by stimulus such as an electrostatic force, reproduction of cold or hot feeling using a heat absorbing device or a heat emitting device, and the like.

The haptic module 154 may be configured to transmit tactile effects (signals) through a user's direct contact, or a user's muscular sense using a finger or a hand. The haptic module 154 may be implemented in two or more in number according to the configuration of the mobile terminal 100.

The memory 160 may store a program for the processing and control of the controller 180. Alternatively, the memory 160 may temporarily store input/output data (e.g., phonebook data, messages, still images, video and the like). Also, the memory 160 may store data related to various patterns of vibrations and audio output upon the touch input on the touch screen.

The memory 160 may be implemented using any type of suitable storage medium including a flash memory type, a hard disk type, a multimedia card micro type, a memory card type (e.g., SD or DX memory), Random Access Memory (RAM), Static Random Access Memory (SRAM), Read-Only Memory (ROM), Electrically Erasable Programmable Read-Only Memory (EEPROM), Programmable Read-Only Memory (PROM), magnetic memory, magnetic disk, optical disk, and the like. Also, the mobile terminal 100 may operate a web storage which performs the storage function of the memory 160 on the Internet.

The interface unit 170 may generally be implemented to interface the mobile terminal with external devices. The interface unit 170 may allow a data reception from an external device, a power delivery to each component in the mobile terminal 100, or a data transmission from the mobile terminal 100 to an external device. The interface unit 170 may include, for example, wired/wireless headset ports, external charger ports, wired/wireless data ports, memory card ports, ports for coupling devices having an identification module, audio Input/Output (I/O) ports, video I/O ports, earphone ports, and the like.

The identification module may be configured as a chip for storing various information required to authenticate an authority to use the mobile terminal 100, which may include a User Identity Module (UIM), a Subscriber Identity Module (SIM), and the like. Also, the device having the identification module (hereinafter, referred to as 'identification device') may be implemented in a type of smart card. Hence, the identification device can be coupled to the mobile terminal 100 via a port.

Also, the interface unit 170 may serve as a path for power to be supplied from an external cradle to the mobile terminal 100 when the mobile terminal 100 is connected to the external cradle or as a path for transferring various command signals input from the cradle by a user to the mobile terminal 100. Such various command signals or power input from the cradle may operate as signals for recognizing that the mobile terminal 100 has accurately been mounted to the cradle.

The controller 180 typically controls the overall operations of the mobile terminal 100. For example, the controller 180 performs the control and processing associated with telephony calls, data communications, video calls, and the like. The controller 180 may include a multimedia module 181 which provides multimedia playback. The multimedia module 181 may be configured as part of the controller 180 or as a separate component.

The controller 180 can perform a pattern recognition processing so as to recognize writing or drawing input on the touch screen as text or image.

The power supply 190 provides power required by various components under the control of the controller 180. The provided power may be internal power, external power, or combination thereof.

Various embodiments described herein may be implemented in a computer-readable medium using, for example, software, hardware, or some combination thereof.

For a hardware implementation, the embodiments described herein may be implemented within one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, microprocessors, other electronic units designed to perform the functions described herein, or a selective combination thereof. In some cases, such embodiments are implemented by the controller 180.

For software implementation, the embodiments such as procedures and functions may be implemented together with separate software modules each of which performs at least one of functions and operations.

The software codes can be implemented with a software application written in any suitable programming language. Also, the software codes may be stored in the memory 160 and executed by the controller 180.

Figure 2:
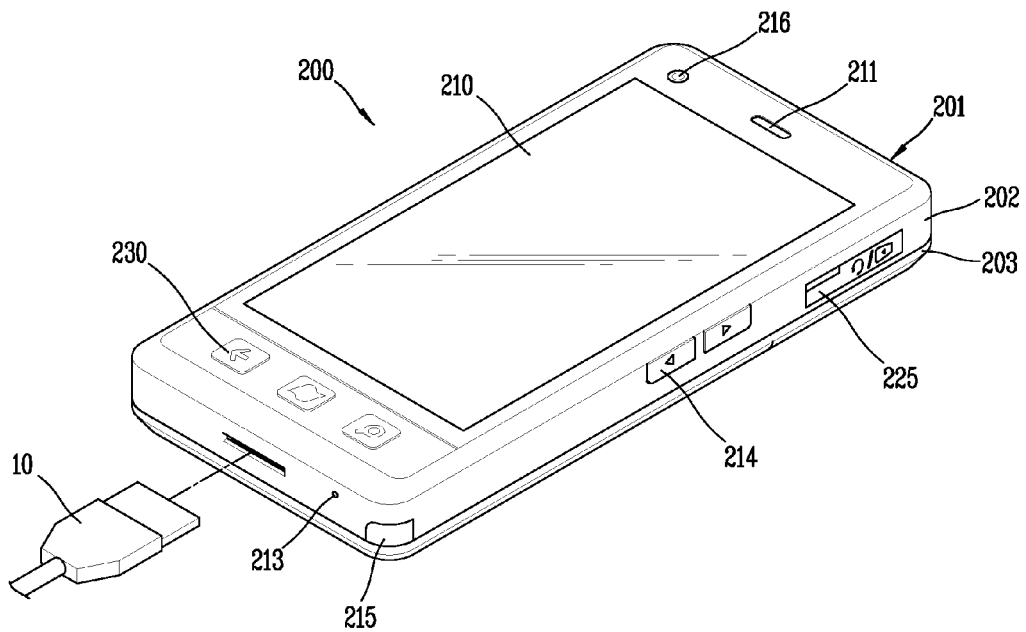
FIG. 2 is a front perspective view of the mobile terminal.
Figure 3:
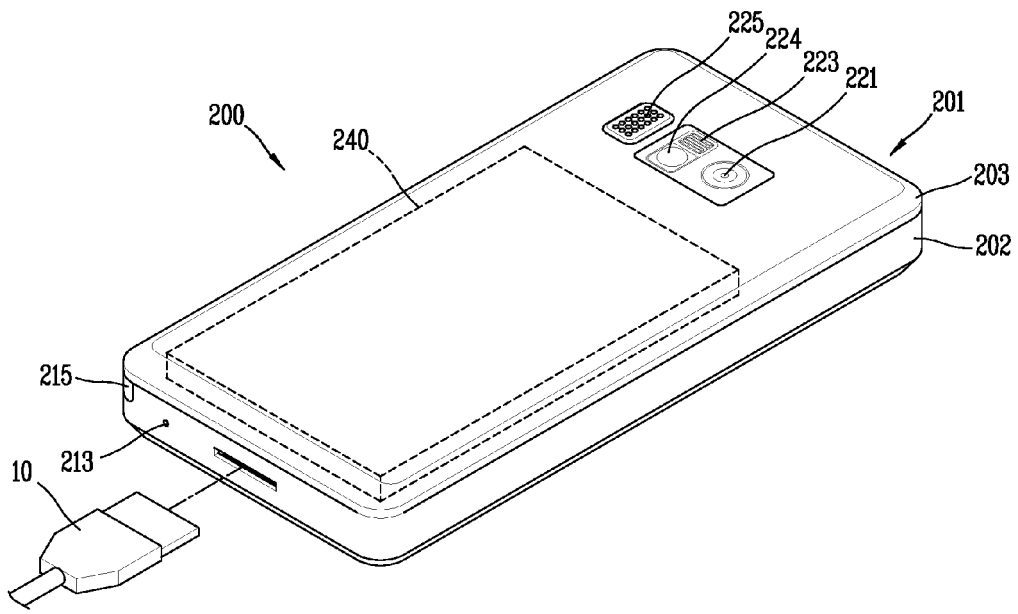
FIG. 3 is a rear perspective view of the mobile terminal shown in FIG. 2.

FIG. 2 is a front perspective view showing an example of the mobile terminal, and FIG. 3 is a rear perspective of the mobile terminal of FIG. 2.

Referring to FIGS. 1 to 3, the mobile terminal 100 disclosed herein is provided with a bar-type terminal body. However, the present application is not limited to this type of terminal, but is also applicable to various structures of terminals such as slide type, folder type, swivel type, swing type, and the like, in which two or more bodies are combined with each other in a relatively movable manner. In addition, the mobile terminal described herein may be applied to random portable electronic devices having a camera and a flash, for example, a cellular phone, a smart phone, a notebook computer, a digital broadcasting terminal, Personal Digital Assistants (PDA), Portable Multimedia Player (PMO) and the like.

The terminal body may include a case (or referred to as casing, housing, cover, etc.) defining an appearance of the mobile terminal 100. In this exemplary embodiment, the case may be divided into a front case 201 and a rear case 202. A space formed between the front and rear cases 201 and 202 may accommodate various electronic components. Such cases may be injected using a synthetic resin or be formed of a metal, such as stainless steel (STS), titanium (Ti) or the like.

A rear surface of the terminal body may be shown having a power supply unit 222, a rear camera 221 and a second audio output module 225.

The power supply unit 222 may supply power to the mobile terminal 100. The power supply unit 222 may be mounted in the terminal body or detachably coupled directly onto the outside of the terminal body.

A flash 223 may be disposed adjacent to the rear camera 221. The flash 223 The flash 123 operates in conjunction with the rear camera 221 when taking a picture using the rear camera 221.

A mirror 224 may be disposed adjacent to the flash 224. The mirror 224 can cooperate with the rear camera 221 to allow a user to photograph himself in a self-portrait mode.

The second audio output module 225 may cooperate with a first audio output module 211, which is disposed on the front surface of the terminal body, to provide stereo output. Also, the second audio output module 225 may be configured to operate as a speakerphone.

The rear camera 221 faces a direction which is opposite to a direction faced by a front camera 211 disposed on the front surface of the terminal body, and may have different pixels from those of the rear camera 221.

For example, the front camera 216 may operate with relatively lower pixels (lower resolution). Thus, the front camera 216 may be useful when a user can capture his face and send it to another party during a video call or the like. On the other hand, the rear camera 221 may operate with relatively higher pixels (higher resolution) such that it can be useful for a user to obtain higher quality pictures for later use. The front and rear cameras 216 and 221 may be installed in the terminal body to be rotatable or popped up.

The front surface of the terminal body may be shown having a display module 210, a first audio output module 211, a signal input unit 230 and a front camera 216.

The display module 210 may output visual information. Examples of the display module 210 may include a Liquid Crystal Display (LCD) module, an Organic Light Emitting Diodes (OLED) module, an e-paper and the like. The display module 210 may include a touch sensor for allowing a touch input. When the touch sensor senses a touch input on a specific point on the display module 210, a content corresponding to the touched point may be input. Contents input by the touch manner may include text or numerals or menu items which are instructed or selected in various modes. The touch sensor may be transparent such that the display module 210 can be viewed, and have a structure for enhancing visibility of a touch screen at a bright place. In FIG. 2, the display module 210 may occupy most of the front surface of the front case 201.

The first audio output module 211 may be implemented as a receiver to transfer a call sound to a user's ear, or a loud speaker for outputting various alarm sounds or multimedia reproduction sounds.

The front camera 216 may receive and process image frames of still pictures or video obtained by image sensors in a video call mode or a capturing mode. The processed image frames may be displayed on a display unit 151.

The image frames processed in the front camera 216 may be stored in the memory 160 or transmitted to the exterior via the wireless communication unit 110. The front camera 216 may be provided by more than two according to usage environments.

The signal input unit 230 may be manipulated to allow inputting of commands for controlling operations of the mobile terminal 100, and include a plurality of input keys. The plurality of input keys may be referred to as a manipulating portion. Such manipulating portion can employ any tactile manner that a user can touch or tap for manipulation.

For example, the signal input unit 230 may be implemented as a dome switch, a touch screen or a touch pad, which allows a user to input commands or information in a pushing or touching manner, or as a wheel for rotating keys or a jog or joystick. Contents input via the signal input unit 230 may be set variously, for example, to input START, END, SCROLL or the like.

A side surface of the front case 201 may be shown having a side key 214, interfaces 212, 225, an audio input unit 213 and the like.

The side key 214 may be referred to as a manipulating unit, and be configured to receive a command for controlling an operation of a mobile terminal 200. The side key 214 may employ any tactile manner that a user can touch or tap for manipulation. Contents input via the side key 214 may be set variously. For example, the side key 214 may receive commands, such as adjusting a volume of sound output via the audio output module 211, 225, converting into a touch recognition mode of the display unit 210, and the like.

The audio (sound) input unit 213 may be implemented as a microphone for receiving user's voice, other sound and the like.

The interface unit 215, 225 may serve as a path for data exchange between a mobile terminal 200 and external devices. For example, the interface unit 215, 225 may be at least one of wired/wireless earphone ports, ports for short-range communication (e.g., IrDA, Bluetooth, WLAN, etc.), power supply terminals for power supply to the mobile terminal and the like. The interface unit 215, 225 may be a card socket for coupling to external cards, such as a Subscriber Identity Module (SIM), a User Identity Module (UIM), a memory card for storage of information and the like.

Figure 4:
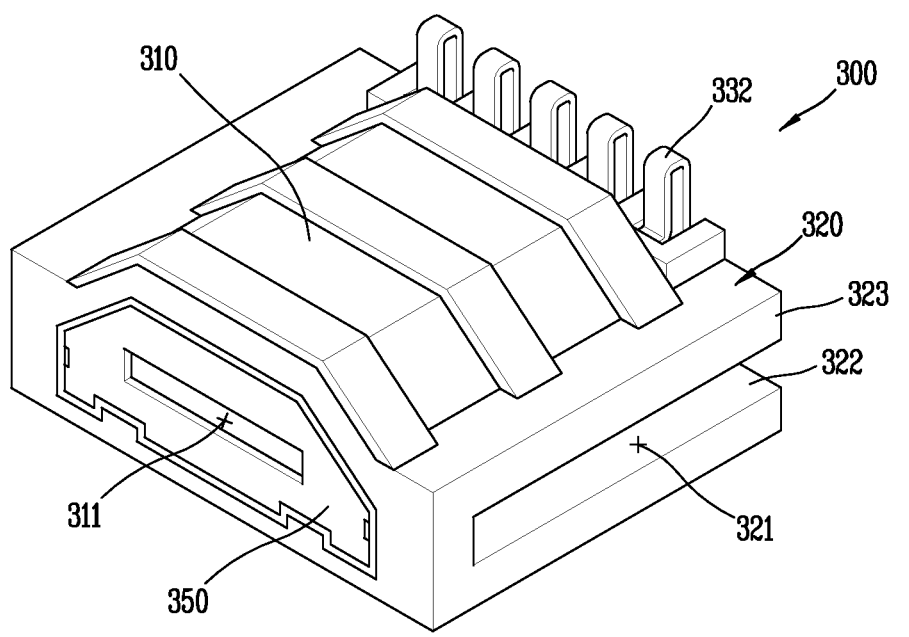
FIG. 4 is a perspective view of a socket module in accordance with a first exemplary embodiment.
Figure 4:
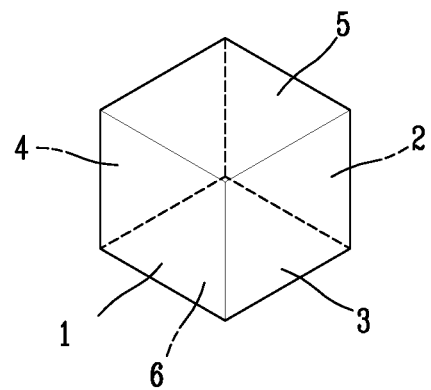

The mobile terminal 200 may include an interface unit implemented as a socket module 300 (see FIG. 4). A plug 10 may be inserted into the socket module 300, for allowing transmission and reception of signals.

First Exemplary Embodiment

Figure 5:
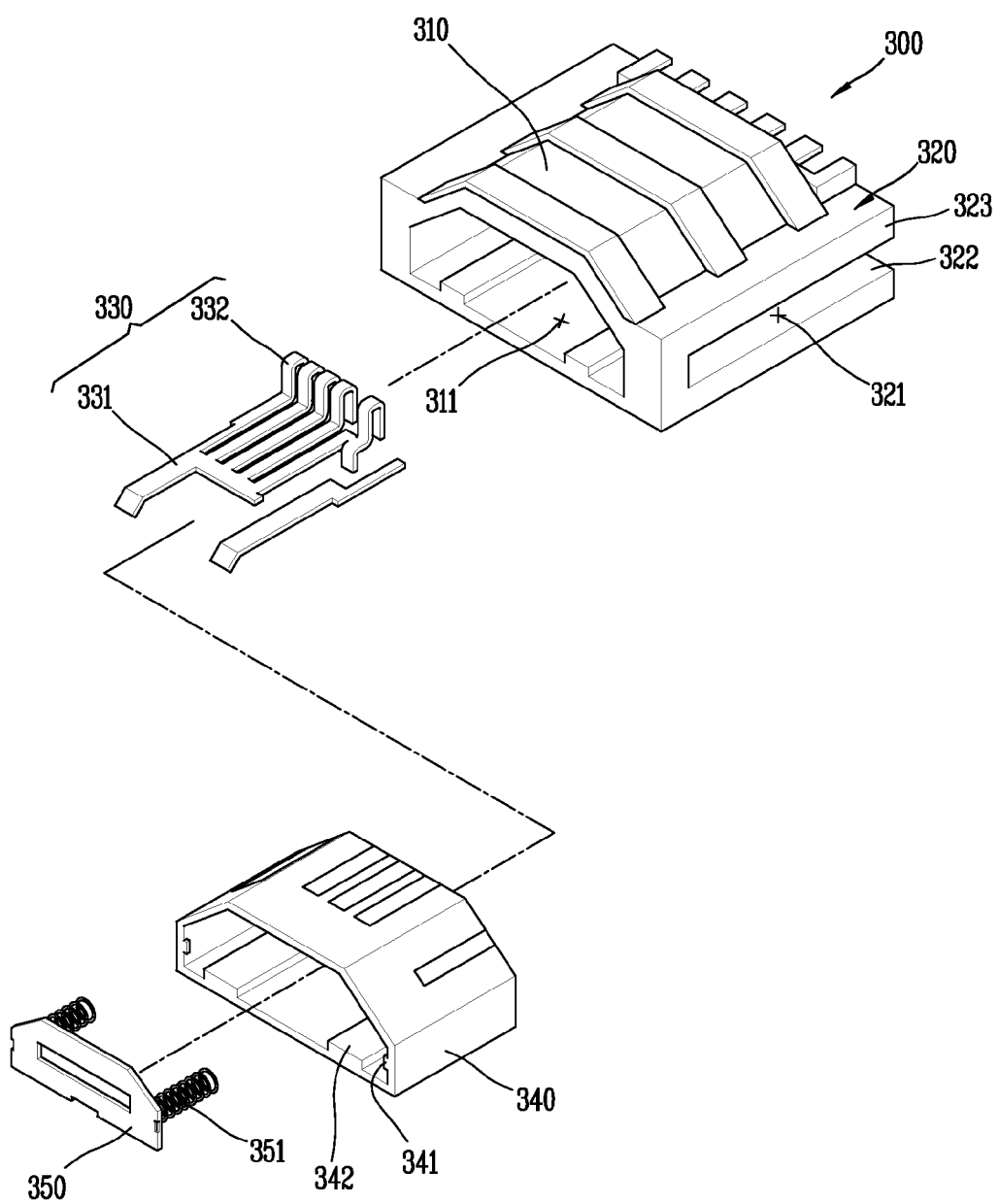
FIG. 5 is a disassembled perspective view of FIG. 4.

FIG. 4 is a perspective view of a socket module in accordance with a first exemplary embodiment, and FIG. 5 is a disassembled perspective view of FIG. 4.

As shown in FIGS. 4 and 5, the socket module 300 may include a housing 310, and a coupling unit 320. An insulating member 340 (see FIG. 5) may be formed on an inner circumferential surface of the housing 310.

A pin assembly 330 connected to the plug 10 may be mounted in an inner space of the housing 310. The housing 310 may be formed in a polyhedral shape. The housing 310 may be formed to cover every surface of the socket module 300 except for one surface having an opening 311, and surround an inner space of the socket module 300. The housing 310 may be made of a metal or synthetic resin, and the pin assembly 330 may be formed of a conductive material. When the housing 310 is formed of the synthetic resin, it may be formed in a molding manner.

In the following exemplary embodiments, for the sake of brief explanation, one surface of the socket module 300 having the opening 311 is referred to as a first surface 1, an opposite surface facing the opening 311 is referred to as a second surface 2, the other side surfaces except for the first surface 1 and the second surface 2 are referred to as a third surface 3 and a fourth surface 4, and upper and lower surfaces of the socket module 300 except for those side surfaces are referred to as a fifth surface 5 and a sixth surface 6.

The coupling unit 320 may be formed on at least one side, for example, the third surface 3 or the fourth surface 4 of the housing 310, or on both sides of the housing 310. The coupling unit 320 may be formed such that the socket module 300 is coupled to a substrate 240 when the socket module 300 is slid with respect to the substrate 240. Here, the sliding direction may be a direction from one side end of the substrate 240 to a central portion thereof.

The socket module 300 is generally mounted to cover the substrate 240. However, in the exemplary embodiments of the present disclosure, the substrate 240 may have a part cut off to form an open space 241 (see FIG. 6A), and the socket module 300 may be slid into the open space 241 to be coupled to the substrate 240. Here, the open space 241 of the substrate 240 may correspond to a size of a section of the socket module 300. Accordingly, the substrate 240 may have a portion, which is recessed from one side thereof into its inside by a predetermined interval.

With the socket module 300 being slid, the socket module 300 may be coupled to the substrate 240 by virtue of a groove member 322 or a protrusion member 422 (see FIG. 9A) on the socket module 300. Or, the groove member 322 or protrusion member 422 may be formed on the substrate 240. Here, a coupling using an adhesive or a coupling using a piece (for example, screw or bolt) may be implemented.

The substrate 240 may include a module mounting unit 242 to which the socket module 300 is mounted. The module mounting unit 242 may be formed at an adjacent portion to the open space 241 of the substrate 240, which is formed to correspond to the section of the socket module 300. A terminal portion 243 may be formed on the module mounting portion 242. The terminal portion 243 may be coupled to a second pin 332.

The socket module 300 may further include a cover 350 for opening or closing the opening 311. Here, the socket module 300 may also include a guide portion 342 for guiding the motion of the cover 350, and a locking protrusion 341 for preventing separation between the cover 350 and the housing 310. The cover 350 may have a shape corresponding to the section of the opening 311. When the plug 10 is inserted, the cover 350 may be slid into the socket module 300 along the guide portion 342.

The cover 350 may be connected to elastic support units 351 to close the opening 311 when the plug 10 is removed. The elastic support unit 351 may have one end connected to the cover 350, and the other end connected to one side surface of the inner space, which faces the cover 350.

The socket module 300 may include a first pin 331 formed within the socket module 300, and a second pin(s) 332 extending to the outside of the socket module 300. The first pin 331 may be electrically connected to the plug 10, and disposed within the housing 310. The second pin 332 may be connected to the first pin 331 and extend to the outside of the housing 310 so that the other end thereof can be connected to the terminal portion 243 of the substrate 240. The second pin 332 may extend in an opposite direction to the opening 311 formed at the housing 310, so as to be connected to the terminal portion 243 of the substrate 240.

The coupling unit 320 may include a groove member 322 or a protrusion member 422 corresponding to the shape of the substrate 240. As shown in FIG. 3, the first exemplary embodiment has illustrated that the coupling unit 320 includes the groove member 322, but a second exemplary embodiment (see FIG. 9A) illustrates that the coupling unit 320 includes the protrusion member 422.

In accordance with the first exemplary embodiment, the coupling unit 320 may include the groove member 322. The groove member 322 may be a part of the coupling unit 320 for defining (limiting) a groove 321 in which the part of the substrate 240 is inserted. When the groove 321 has a width approximately the same as a thickness of the substrate 240, the substrate 240 may be engaged with the groove member 322 upon insertion. Unlike this, the recess may be formed so that its width can gradually increase or decrease toward any one side. Accordingly, when the socket module 300 is slid, the recess may increase a frictional force to restrict the sliding of the socket module 300 when the socket module 300 is slid up to a predetermined position.

The coupling unit 320 may include an extension member 323 which extends toward the substrate 240 to cover an inserted portion of the substrate 240 when the substrate 240 is partially inserted into the groove 321. The extension member 323 may have a predetermined length to cover the upper surface and the lower surface of the substrate 240, thereby allowing more stable coupling between the socket module 300 and the substrate 240.

Also, the coupling unit 320 and the substrate 240 may include a lock portion 324 and a stopping portion 244, by which the socket module 300 and the substrate 240 are fixed in the coupled state. Here, when the lock portion 324 is formed on one of the socket module 300 and the substrate 240, the stopping portion 244 may be formed on the other of the socket module 300 and the substrate 240. The lock portion 324 may be a protrusion protruding to the outside, and the stopping portion 244 may be a portion recessed inwardly so that the lock portion 324 is locked therein. The lock portion 324 may be elastically transformed such that the socket module 300 can be detachably coupled to the substrate 240.

Figure 6A:
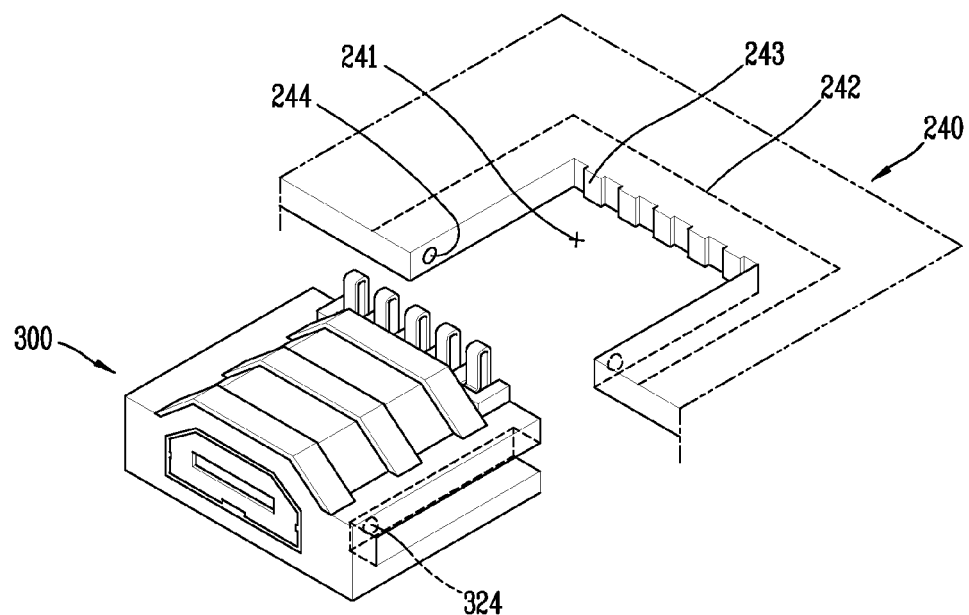
FIGS. 6A to 6C are views each showing a coupled state between the socket module and a substrate.
Figure 6B:
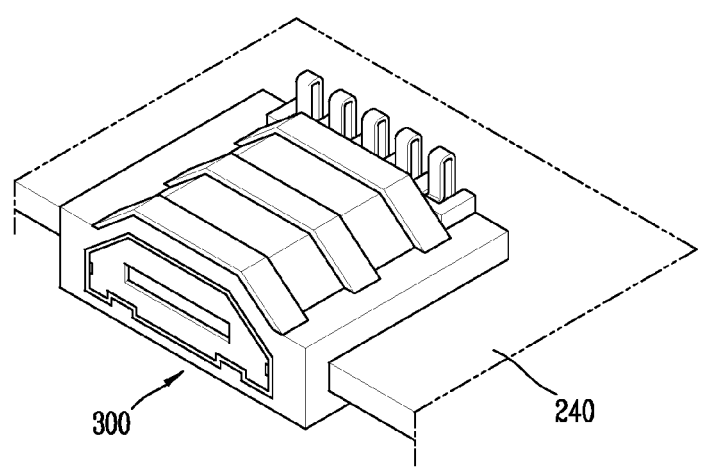
Figure 6C:
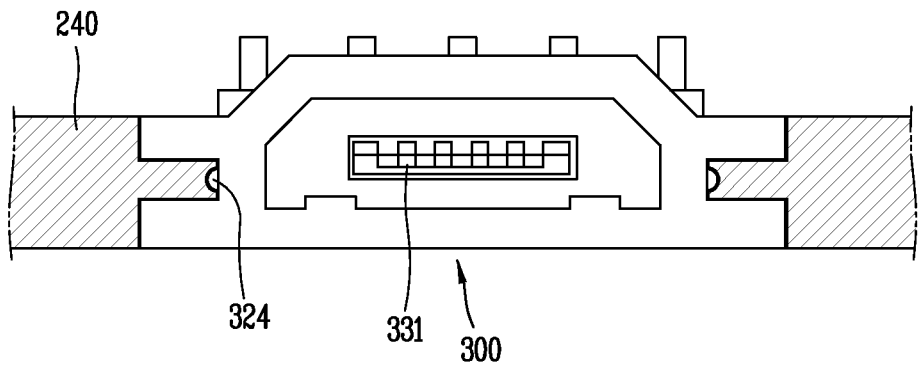

FIGS. 6A to 6C are views each showing a coupled state between the socket module and a substrate. In more detail, FIG. 6A shows a state before the socket module 300 is coupled to the substrate 240, FIG. 6B shows a coupled state between the socket module 300 and the substrate 240, and FIG. 6C is a sectional view in the coupled state between the socket module 300 and the substrate 240.

As shown in FIG. 6A, the socket module 300 may be slid toward the module mounting unit 242 which is the partially open portion of the substrate 240. Here, the groove member 322 may contact the substrate 240, and then the substrate 240 may be inserted into the groove 321 limited by the groove member 322.

When the socket module 300 is slid into the substrate 240 by a predetermined depth, the socket module 300 may be fixed by a frictional force between the groove member 322 and the substrate 240.

Unlike this, a substrate assembly that the socket module 300 and the substrate 240 are coupled to each other may include the lock portion 324 and the stopping portion 244. With the socket module 300 and the substrate 240 coupled to each other, the lock portion 324 may contact the stopping portion 244, fixing the socket module 300 to the substrate 240.

Consequently, as the socket module 300 is coupled to the substrate 240 in the sliding manner, the substrate assembly that the socket module 300 and the substrate 240 are coupled to each other may become slimmer by a thickness of the substrate 240.

Varied Embodiment

Figure 7:
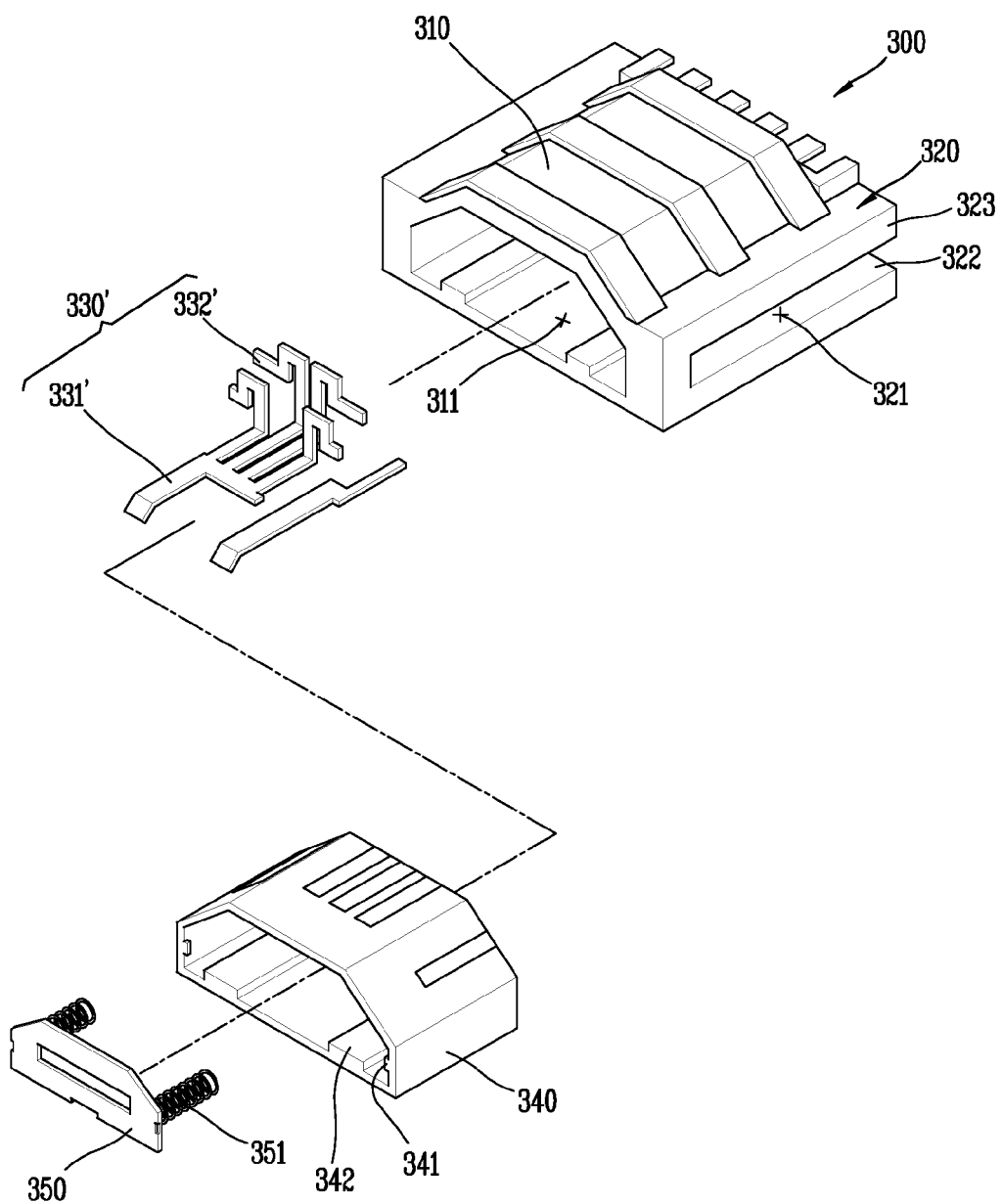
Figure 8A:
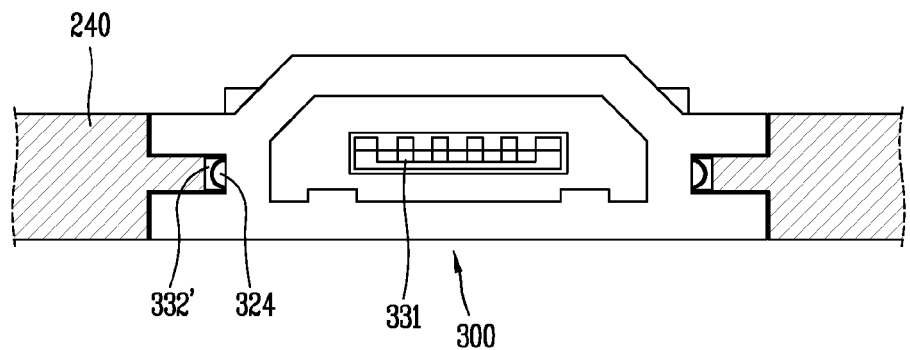
FIGS. 8A and 8B are conceptual views showing a variation of the socket module of FIG. 4 according to the shape of the varied pin of FIG. 7.
Figure 8B:
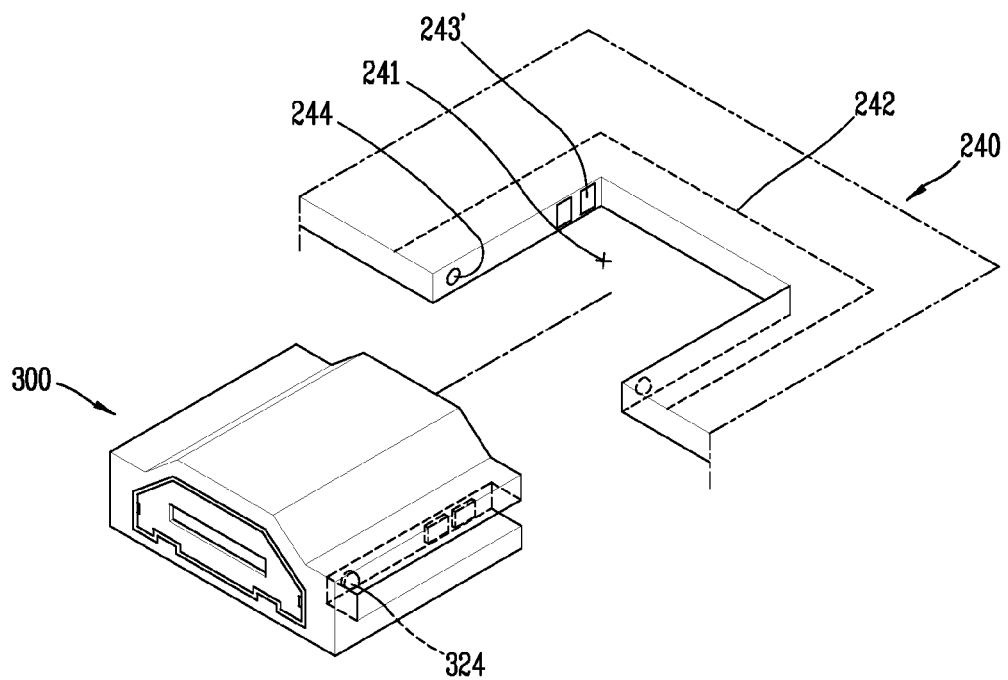

FIG. 7 is a conceptual view showing a variation of a pin shown in FIG. 5, and FIGS. 8A and 8B are conceptual views showing a variation of the socket module of FIG. 4 according to the shape of the varied pin of FIG. 7.

As shown in FIG. 7, a first pin 331' formed within the housing 310 may be connected to the plug 10, and a second pin 332' formed on the outside of the housing 310 may extend in a different direction (e.g., toward the third or fourth surface) from the first exemplary embodiment (e.g., toward the second surface).

That is, in the first exemplary embodiment, the second pin 332 may extend toward the second surface, as the opposite side to the position of the opening 311 of the housing 310. On the contrary, in the varied embodiment, when the opening 311 is viewed at front, the second pin 332' may extend toward at least one side surface, namely, toward the third surface 3 or the fourth surface 4.

As shown in FIGS. 8A and 8B, the second pin 332' may extend toward one side surface of the housing 310 and penetrate through the groove member 322. In addition, a terminal portion 243' electrically connected to the second pin 332' may be formed on one side surface of the substrate 240 inserted into the coupling unit 320.

Therefore, without a separate process, such as soldering, the socket module 300 may be coupled to the substrate 240 in the sliding manner. This may allow the second pin 332' to be connected to the terminal portion 243'.

Also, to fix the second pin 332' and the terminal portion 243' in the connected state, the coupling unit 320 and the substrate 240 may include a lock portion 324 or a stopping portion 244.

Second Exemplary Embodiment

Figure 9A:
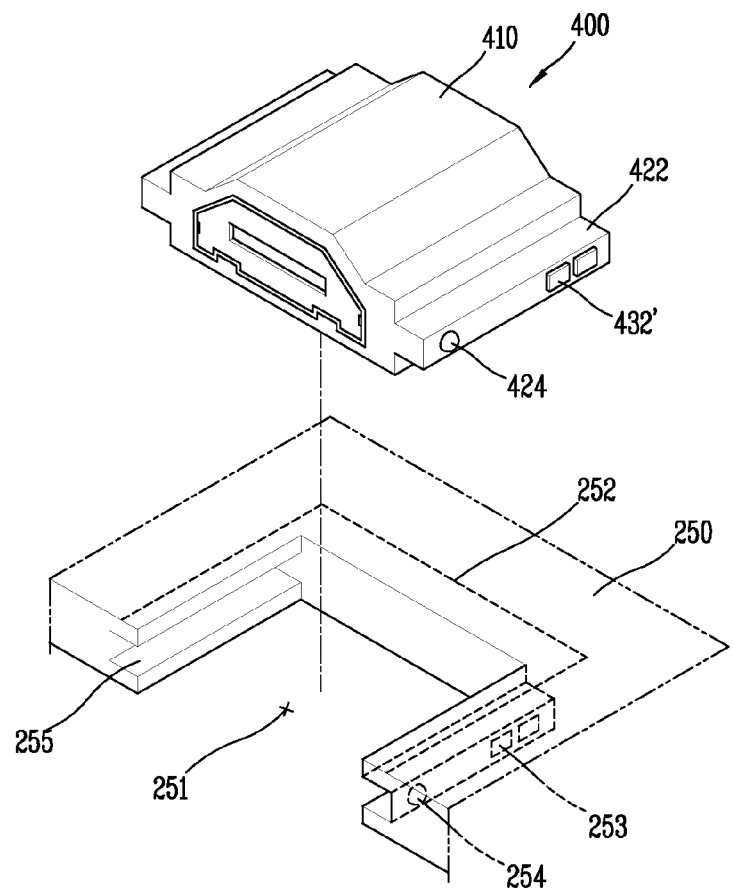
FIGS. 9A and 9B are conceptual views of a socket module in accordance with a second exemplary embodiment.
Figure 9B:
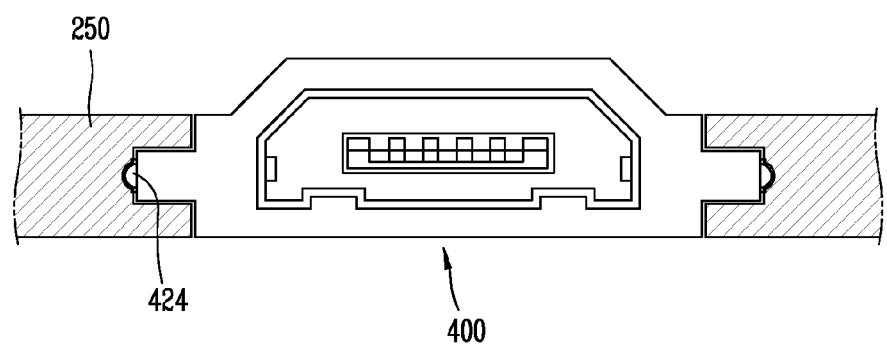

FIGS. 9A and 9B are conceptual views of a socket module 400 in accordance with a second exemplary embodiment.

FIG. 9A shows a state before the socket module 400 is coupled to a substrate 250, and FIG. 9B shows the coupled state between the socket module 400 and the substrate 250.

A housing 410, a cover 450 and a pin according to this exemplary embodiment will also be understood by the description given of those components in the first exemplary embodiment and the varied embodiment.

In accordance with the second exemplary embodiment, a coupling unit 420 may include a protrusion member 422 protruding toward the substrate 250. A groove portion 255 may be formed at the substrate 250 in correspondence with the protrusion member 422.

The substrate 250 may include a module mounting unit 252 to which the socket module 400 is mounted. The module mounting unit 252 may be formed at a portion adjacent to an open area of the substrate 250, which is formed by cutting off a part of the substrate 250 to correspond to the section of the socket module 400. The groove portion 255 may be formed along an inner circumferential surface of the module mounting unit 252.

When the protrusion member 422 of the socket module 400 is slidably inserted into the groove portion 255 of the substrate 250, the socket module 400 may be coupled to the substrate 250. This may result in reducing a thickness of the substrate assembly having the socket module 400 by the thickness of the substrate 250.

As described in the varied embodiment, a second pin 432' may extend toward at least one side surface of the housing 410. Here, the second pin 432' may protrude through the protrusion member 422 to be electrically connected to terminal portion 253 formed on the groove portion 255.

Third Exemplary Embodiment

Figure 10A:
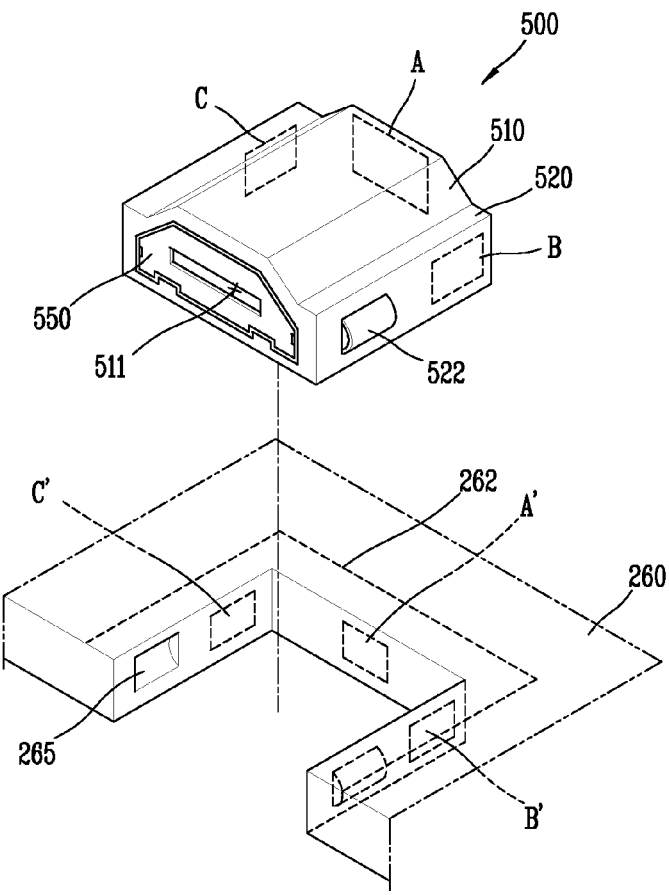
FIGS. 10A and 10B are conceptual views of a socket module in accordance with a third exemplary embodiment.
Figure 10B:
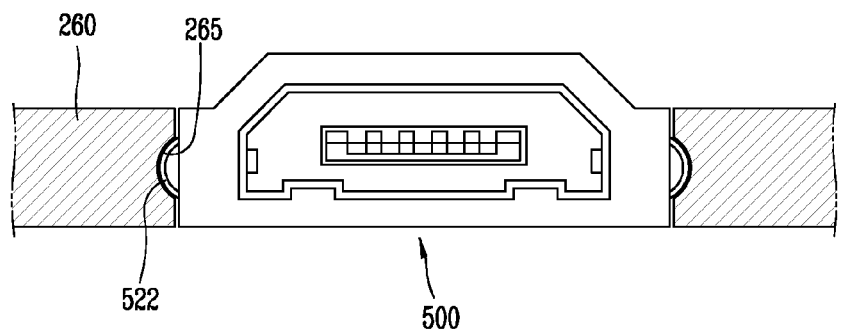

FIGS. 10A and 10B are conceptual views of a socket module 500 in accordance with a third exemplary embodiment. FIG. 10A shows a state before the socket module 500 is coupled to a substrate 260, and FIG. 10B shows the coupled state between the socket module 500 and the substrate 260.

A housing 510, a cover 550 and a pin according to this exemplary embodiment will also be understood by the description given of those components in the first exemplary embodiment and the exemplary variation.

Referring to FIG. 10A, when an opening 511 is viewed at front, a second pin may be formed on a second surface 2 facing the first surface 1 of the housing 510 having the opening 511, an upper surface of the housing 510, or the third or fourth surface 3 or 4 corresponding to at least one side surface of the housing 510. That is, when the second pin is located on an area A, an area B or an area C, a terminal portion may be formed at a corresponding area A', B' or C' on the substrate 260.

Referring to FIG. 10B, a coupling unit 520 may include a protrusion member 522 protruding in a lateral direction. The protrusion member 522 may be elastically transformable. The substrate 260 may include a recess portion 265 corresponding to the protrusion member 522.

The socket module 500 according to the third exemplary embodiment may be slid in a direction penetrating through the substrate 260, unlike the previous exemplary embodiments, thereby being coupled to the substrate 260.

Fourth Exemplary Embodiment

Figure 11A:
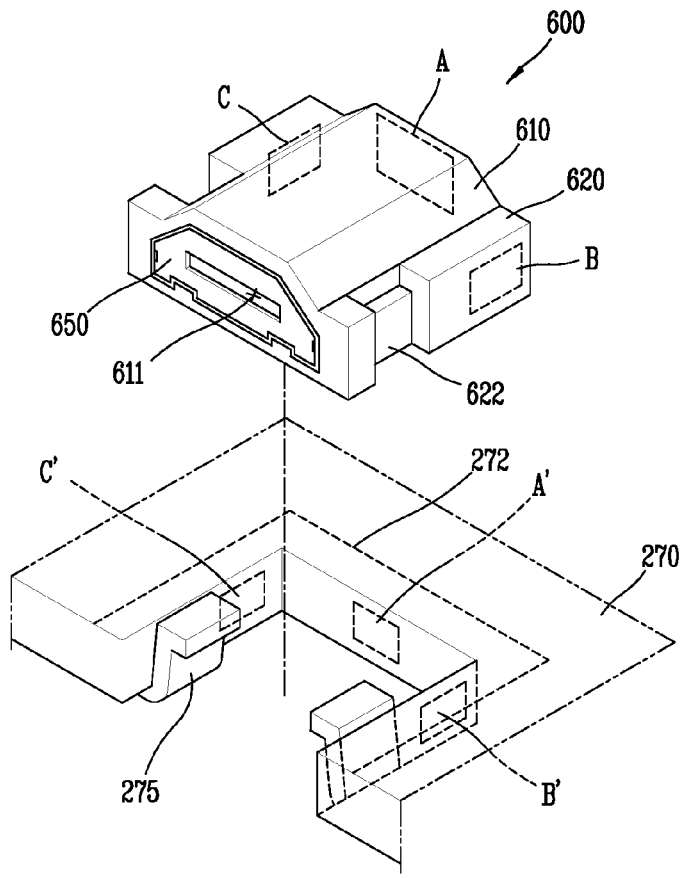
FIGS. 11A and 11B are conceptual views of a socket module in accordance with a fourth exemplary embodiment.
Figure 11B:
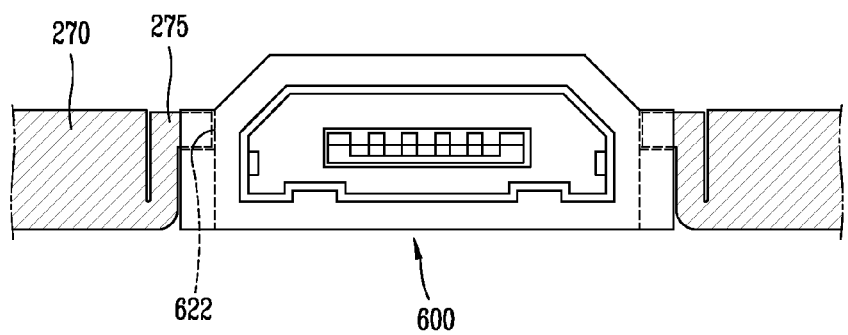

FIGS. 11A and 11B are conceptual views of a socket module 600 in accordance with a fourth exemplary embodiment. FIG. 11A shows a state before the socket module 600 is coupled to a substrate 270, and FIG. 10B shows the coupled state between the socket module 600 and the substrate 270.

A housing 610, a cover 650 and a pin according to this exemplary embodiment will also be understood by the description given of those components in the first exemplary embodiment and the exemplary variation.

Referring to FIG. 11A, when an opening 611 is viewed at front, a second pin may be formed on a second surface 2 facing the first surface 1 of the housing 610 having the opening 611, an upper surface of the housing 610, or the third or fourth surface 3 or 4 corresponding to at least one side surface of the housing 610. That is, when the second pin is located on an area A, an area B or an area C, a terminal portion may be formed at a corresponding area A', B' or C' on the substrate 260.

As shown in FIG. 11A, a coupling unit 620 may include a recess member 622 recessed inwardly from a side surface of the housing 610. In correspondence with the recess member 622, the substrate 270 may include an elastic protrusion portion 275. The elastic protrusion portion 275 may protrude toward the recess member 622 to be elastically transformable.

The socket module 600 according to the fourth exemplary embodiment may be slidable in a direction penetrating through the substrate 270, unlike the previous exemplary embodiments, thereby being coupled to the substrate 270.

When the socket module 600 starts sliding in a direction of penetrating through the substrate 270, the elastic protrusion portion 275 may temporarily move toward the substrate 270 and be charged with an elastic energy. Then, when the sliding of the socket module 600 is completed, the elastic protrusion portion 275 may move toward the recess member 622 by discharging the charged elastic energy, to be coupled to the recess member 622.

The elastic protrusion portion 275 may include a base member having one end fixed to the substrate 270, and an extension member extending from the base member by a predetermined angle. A hook member may be formed at an end of the extension member may be fixedly coupled to a fixing groove formed at the recess member 622.

Figure 12:
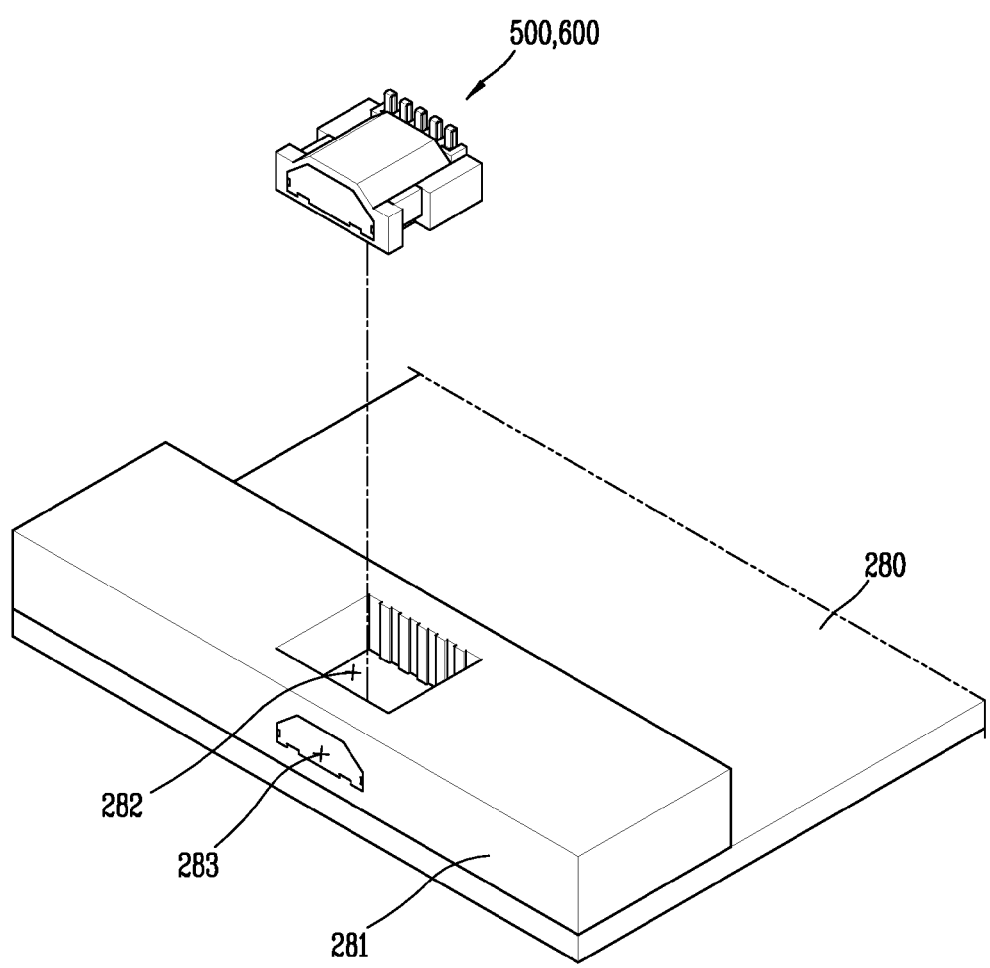
FIG. 12 is a conceptual view showing a state before the socket module according to the third or fourth exemplary embodiment is coupled to a carrier.

FIG. 12 is a conceptual view showing a state before the socket module 500, 600 according to the third or fourth exemplary embodiment is coupled to a carrier 281.

The carrier 281 may have one surface with radiation patterns of an antenna and include a dielectric substance. The carrier 281 may have a predetermined volume in view of feature of an antenna. Accordingly, it may make it difficult to reduce a size of a mobile terminal. Therefore, when the socket module 500, 600 is mounted to the carrier 281, it may allow for more efficient use of a space of the mobile terminal.

The carrier 281 may include a hole or groove 282 in which the socket module 500, 600 can be mounted. A terminal portion may be formed at at least one side of the hole or groove 282 to be coupled to the pin of the socket module 500, 600. The terminal portion may be electrically connected up to a circuit board 280.

The carrier 281 may also include a communication hole 283 communicating with the opening of the socket module 500, 600.

The socket module 500, 600 may be slidably mounted in the hole or groove 282 and electrically connected to the terminal portion. An elastic protrusion portion or a recess portion described in the third to fourth exemplary embodiments may be formed on one side surface of the hole or recess 282. This may be used to fix the socket module 500, 600 when the socket module is slidably mounted.

The foregoing embodiments and advantages of the socket module and the terminal having the same are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A socket module couplable to a substrate to transfer an electrical signal from the socket module to the substrate, the socket module comprising:
   a housing having an opening at one surface thereof, the opening being configured to receive a plug inserted into the opening;
   a coupling unit located at at least one side of the housing, the coupling unit being slidable in a sliding direction with respect to the substrate upon coupling of the socket module to the substrate;
   a cover formed to open or close the opening, and
   a locking protrusion formed in the opening, the locking protrusion being engagable/disengageable with the cover to prevent separation of the cover from the housing.

2. The socket module of claim 1, wherein the coupling unit comprises a groove member or a protrusion member corresponding to a shape of the substrate, to be coupled to the substrate by being moved in the sliding direction.

3. The socket module of claim 2, wherein the protrusion member is elastically deformable.

4. A terminal comprising:
   a terminal body;
   a substrate mounted to the terminal body; and
   a socket module coupled to the substrate to transfer an electrical signal from the socket module to the substrate, wherein the socket module comprises:
      a housing having an opening at one surface thereof, the opening being configured to receive a plug inserted into the opening;
      a coupling unit located at at least one side of the housing, the coupling unit being slidable in a sliding direction with respect to the substrate upon coupling of the socket module to the substrate;
      a cover formed to open or close the opening; and
      a locking protrusion formed in the opening, the locking protrusion being engagable/disengageable with the cover to prevent separation of the cover from the housing.

5. The terminal of claim 4, further comprising a lock portion protruding from one of the coupling unit and the substrate, and a stopping portion formed at the other one of the coupling unit and the substrate in a shape corresponding to the lock portion, the lock portion being received in the stopping portion to retain the socket module to the substrate in a coupled state.

6. The socket module of claim 1, wherein the coupling unit comprises a groove member corresponding to a shape of the substrate, the groove member extending only partially along a length of the housing such that a portion of the housing extends beyond the substrate.

7. The terminal of claim 4, wherein the substrate comprises a module mounting unit opened into a shape corresponding to a section of the socket module, and
wherein the socket module is mounted to the module mounting unit.

8. The terminal of claim 7, wherein the sliding direction is a direction passing through the substrate.

9. The terminal of claim 8, wherein the coupling unit comprises an elastic protrusion member protruding toward the substrate, the elastic protrusion member being elastically deformable, and
wherein the substrate comprises a recess portion corresponding to the elastic protrusion member, the elastic protrusion member being received in the recess portion to retain the socket module to the substrate in a coupled state.

10. The terminal of claim 8, wherein the coupling unit comprises a recess member recessed inwardly, and
wherein the substrate comprises an elastic protrusion portion protruding toward the recess member, the elastic protrusion portion being elastically deformable, the elastic protrusion portion being received in the recess member to retain the socket module to the substrate in a coupled state.

11. The terminal of claim 7, wherein the socket module further comprises:
a first pin disposed within the housing, the first pin being electrically connectable to the plug; and
a second pin having one end connected to the first pin and the other end extending outside of the housing to be connected to the substrate.

12. The terminal of claim 11, wherein the coupling unit comprises a protrusion member, and
wherein the substrate comprises a groove portion into which the protrusion member is inserted upon sliding of the coupling unit in the sliding direction with respect to the substrate.

13. The terminal of claim 12, wherein the second pin extends through the protrusion member to be electrically connected to a terminal portion located at the groove portion of the substrate.

14. The terminal of claim 11, wherein the coupling unit comprises a groove member into which a part of the substrate is inserted upon sliding of the coupling unit in the sliding direction with respect to the substrate.

15. The terminal of claim 14, wherein the coupling unit further comprises an extension member adjacent to the groove member and extending toward the substrate to cover a portion of the substrate.

16. The terminal of claim 14, wherein the second pin extends to the groove member to be electrically connected to a terminal portion located on the substrate.

17. A terminal comprising:
a terminal body:
a substrate mounted to the terminal body; and
a socket module coupled to the substrate to transfer an electrical signal from the socket module to the substrate,
wherein the socket module comprises:
a housing having an opening at one surface thereof, the opening being configured to receive a plug inserted into the opening;
a coupling unit located at at least one side of the housing, the coupling unit being slidable in a sliding direction with respect to the substrate upon coupling of the socket module to the substrate:
a first pin disposed within the housing, the first pin being electrically connectable to the plug; and
a second pin having one end connected to the first pin and the other end extending outside of the housing to be connected to the substrate,
wherein the substrate comprises a module mounting unit opened into a shape corresponding to a section of the socket module, the socket module being mounted to the module mounting unit,
wherein the coupling unit comprises a groove member into which a part of the substrate is inserted upon sliding of the coupling unit in the sliding direction with respect to the substrate, and
wherein the second pin extends to the groove member to be electrically connected to a terminal portion located on the substrate.

* * * * *